United States Patent
Choi et al.

(10) Patent No.: US 9,383,398 B2
(45) Date of Patent: Jul. 5, 2016

(54) MOTOR POWER SIMULATING APPARATUS FOR FUEL CELL POWER MODULE EVALUATION

(71) Applicant: Hyundai Motor Company, Seochu-gu, Seoul (KR)

(72) Inventors: Sung Bum Choi, Gyeonggi-do (KR); Ii Hee Cho, Seoul (KR)

(73) Assignee: Hyundai Motor Company, Seoul (KR)

( * ) Notice: Subject to any disclaimer, the term of this patent is extended or adjusted under 35 U.S.C. 154(b) by 255 days.

(21) Appl. No.: 13/688,137

(22) Filed: Nov. 28, 2012

(65) Prior Publication Data

US 2014/0055123 A1 Feb. 27, 2014

(30) Foreign Application Priority Data

Aug. 21, 2012 (KR) .......................... 10-2012-0091160

(51) Int. Cl.
| | |
|---|---|
| *G01R 19/00* | (2006.01) |
| *G01R 31/08* | (2006.01) |
| *G01R 31/00* | (2006.01) |
| *H01M 8/04* | (2016.01) |
| *G01R 31/28* | (2006.01) |

(52) U.S. Cl.
CPC ........... *G01R 31/00* (2013.01); *H01M 8/04298* (2013.01); *G01R 31/2839* (2013.01); *H01M 2250/20* (2013.01); *H01M 2250/40* (2013.01); *Y02E 60/50* (2013.01); *Y02E 60/56* (2013.01); *Y02T 90/32* (2013.01)

(58) Field of Classification Search
CPC ....... H03F 19/00; H02M 3/335; G01R 31/00; G01R 31/2839; Y02E 60/50; H01M 8/04313; H01M 8/04664; H01M 8/04679; H01M 8/04298
USPC ........... 324/271, 76.11, 415, 76.39, 503, 525, 324/383, 523
See application file for complete search history.

(56) References Cited

U.S. PATENT DOCUMENTS

| | | | | |
|---|---|---|---|---|
| 3,787,776 | A * | 1/1974 | Cath et al. ......................... | 330/2 |
| 4,484,237 | A * | 11/1984 | Muto ............................... | 360/25 |
| 4,602,871 | A * | 7/1986 | Hanaoka ........................ | 374/102 |
| 7,315,150 | B1 * | 1/2008 | Coleman ........................ | 323/222 |
| 7,518,886 | B1 * | 4/2009 | Lai et al. .......................... | 363/17 |
| 2004/0099218 | A1 * | 5/2004 | Yang et al. ..................... | 118/726 |
| 2004/0212741 | A1 * | 10/2004 | Hijikata et al. ............... | 348/707 |
| 2006/0074574 | A1 * | 4/2006 | Gasda et al. .................... | 702/63 |
| 2010/0019749 | A1 * | 1/2010 | Katsuya et al. ............... | 323/282 |

FOREIGN PATENT DOCUMENTS

| | | |
|---|---|---|
| JP | 2003-264000 A | 9/2003 |
| JP | 2007-265885 A | 10/2007 |

(Continued)

*Primary Examiner* — Amy He
(74) *Attorney, Agent, or Firm* — Mintz Levin Cohn Ferris Glovsky and Popeo, P.C.; Peter F. Corless

(57) ABSTRACT

Disclosed is a motor power simulating apparatus for fuel cell power module evaluation that accurately reflects real world characteristics of a fuel cell vehicle. More particularly, the power simulating apparatus disclosed herein includes a fuel cell power module, a ripple current generator, and an electronic load device, the ripple current generator connected to the fuel cell power module and the electronic load device to accurately simulate power output from a fuel cell of a fuel cell vehicle under real world conditions.

4 Claims, 2 Drawing Sheets

(56) References Cited

FOREIGN PATENT DOCUMENTS

| | | | |
|---|---|---|---|
| JP | 2007-265894 A | 10/2007 | |
| KR | 10-0731148 B1 | 6/2007 | |
| KR | 10-0766473 B1 | 10/2007 | |

\* cited by examiner

MOTOR POWER SIMULATING APPARATUS FOR FUEL CELL POWER MODULE EVALUATION

CROSS-REFERENCE TO RELATED APPLICATION

This application claims under 35 U.S.C. §119(a) the benefit of Korean Patent Application No. 10-2012-0091160, filed on Aug. 21, 2012, the entire contents of which are incorporated herein by reference.

BACKGROUND (a) Technical Field

The present invention relates to a motor power simulating apparatus and, more particularly, to a motor power simulating apparatus for fuel cell power module evaluation.

(b) Background Art

A fuel cell is a power generator that converts chemical energy directly into electric energy by an electrochemical reaction between hydrogen contained in a hydrocarbon-based material (e.g., methanol, natural gas, etc.) and oxygen contained in the air. Unlike a conventional combustion engine, or a charge/discharge battery, the fuel cell is a pure-energy converter of high efficiency.

In general, the amount of electricity obtained from a fuel cell changes depending on the amount, concentration, and pressure of the fuel used. Additionally, the durability and performance of a hydrogen fuel-cell vehicle may be based on the power generated by a power module of the fuel cell (e.g., a stack, an air supply device, a hydrogen supply device, a cooling device, or the like). In other words, the properties of a fuel cell vehicle, i.e., durability, performance, etc., may be assessed and inferred by evaluating the properties of the power module of the fuel cell.

Conventional methods for evaluating a fuel cell power module are based on assessing the performance (i.e., voltage) of the fuel cell by supplying hydrogen and oxygen to the fuel cell with an electronic load and drawing current from the fuel cell. For example, fuel cell system power evaluators used in Japan and the U.S. evaluate the power of the fuel cell system by installing a motor dynamometer and simulating a vehicle state. Unfortunately, such fuel cell system power evaluators require a separate facility of large size that contains expensive equipment (e.g., a motor dynamometer), which makes power module assessment of mass produced fuel cell modules cost prohibitive. Accordingly, there is a need for new and improved methods and apparatus to evaluate fuel cell power modules.

SUMMARY OF THE DISCLOSURE

Accordingly, the present invention provides a motor power simulating apparatus for fuel cell power module evaluation that reflects properties of a vehicle. More particularly, the present invention provides a motor power simulating apparatus that includes a ripple current generator, which is capable of simulating a fuel cell vehicle motor to evaluate the power of a fuel cell. Advantageously, the present invention eliminates the requirement for a separate testing facility, and reduces the amount of costly test equipment (e.g., a motor dynamometer) required to evaluate a fuel cell power module.

According to an aspect of the present invention, there is provided a motor power simulation apparatus for fuel cell power module evaluation that reflects vehicle properties, which includes a fuel cell power module, a ripple current generator connected to the fuel cell power module to generate ripple current when the fuel cell power module generates power, and an electronic load device for consuming the power generated in the fuel cell power module. According to the techniques herein, the apparatus provides power module evaluations that accurately reflect vehicle conditions, and which are equivalent evaluation results that may be achieved with conventional testing/evaluation facilities.

The ripple current generator may include a variable resistor that may changes while having a predetermined frequency, or a frequency in a white noise form, at a positive (+) terminal of an output line coming from the fuel cell power module so as to simulate ripple current generated in a vehicle.

BRIEF DESCRIPTION OF THE DRAWINGS

The above and other features of the present invention will now be described in detail with reference to an exemplary embodiment thereof illustrated by the accompanying drawings, which are given hereinbelow by way of illustration only, and thus are not limitative of the present invention, and wherein.

DETAILED DESCRIPTION

Figure 1:
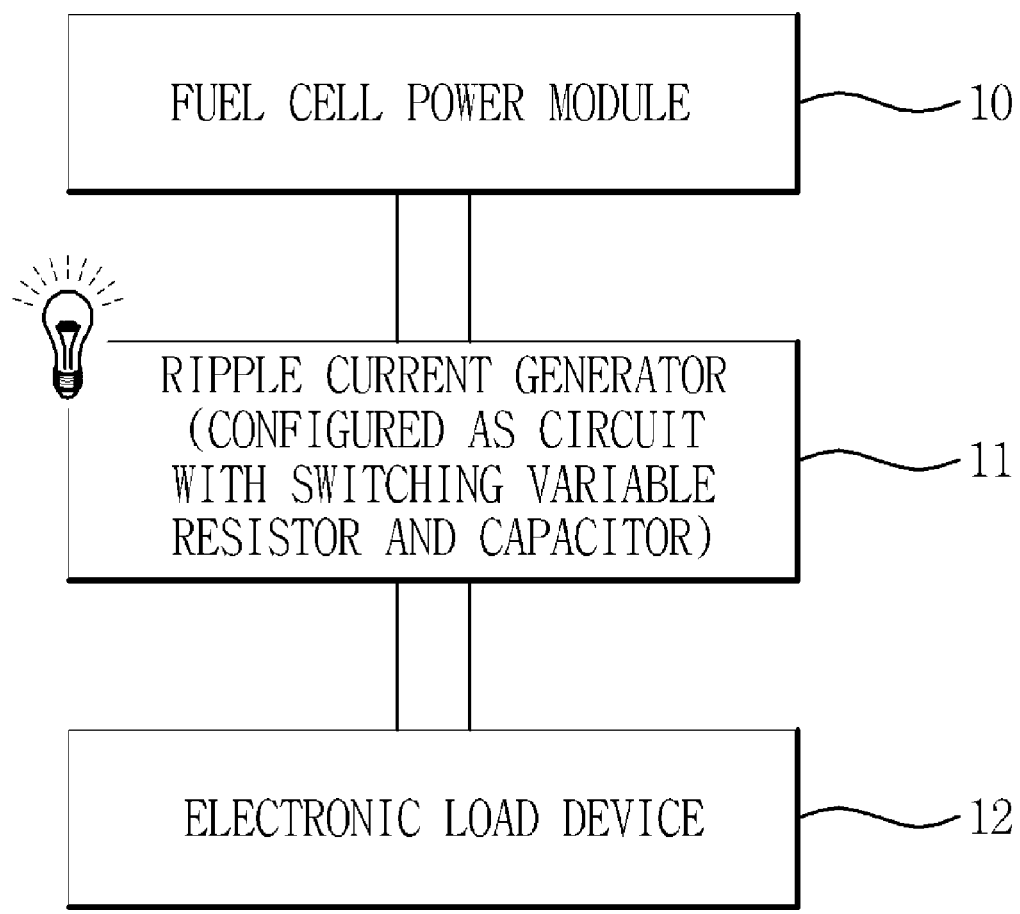
FIG. 1 is a structural diagram of an exemplary motor power simulation apparatus for fuel cell power module evaluation which reflects properties of a vehicle, according to the present invention.

Hereinafter reference will now be made in detail to various embodiments of the present invention, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Ranges provided herein are understood to be shorthand for all of the values within the range. For example, a range of 1 to 50 is understood to include any number, combination of numbers, or sub-range from the group consisting of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50, as well as all intervening decimal values between the aforementioned integers such as, for example, 1.1, 1.2, 1.3, 1.4, 1.5, 1.6, 1.7, 1.8, and 1.9. With respect to sub-ranges, "nested sub-ranges" that extend from either end point of the range are specifically contemplated. For example, a nested sub-range of an exemplary range of 1 to 50 may comprise 1 to 10, 1 to 20, 1 to 30, and 1 to 40 in one direction, or 50 to 40, 50 to 30, 50 to 20, and 50 to 10 in the other direction.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Additionally, it is understood that the below methods are executed by at least one controller. The term controller refers to a hardware device that includes a memory and a processor. The memory is configured to store the modules and the processor is specifically configured to execute said modules to perform one or more processes which are described further below.

Furthermore, the control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Figure 2:
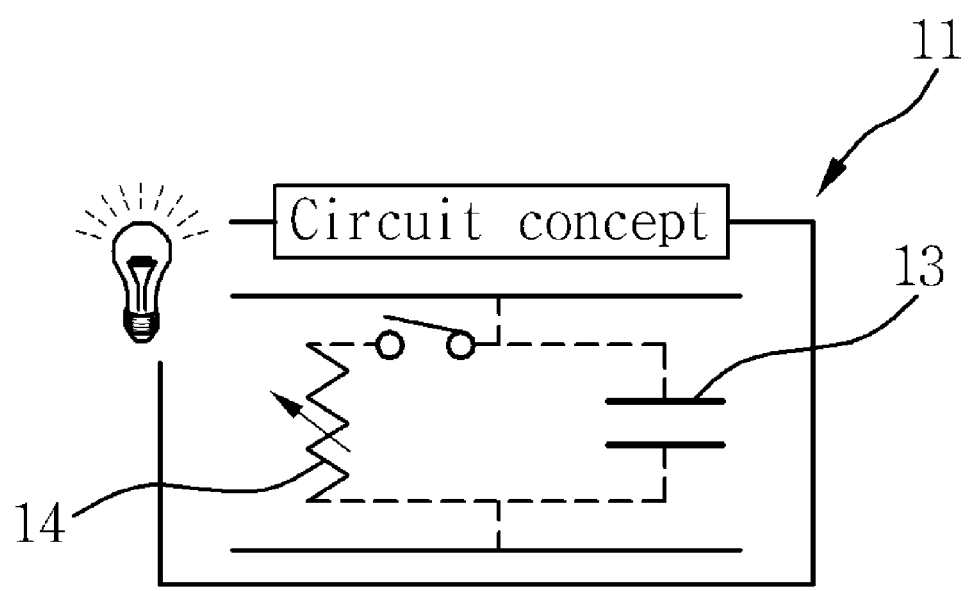
FIG. 2 is a circuit diagram of the ripple generator shown in FIG. 1.

FIG. 1 is a structural diagram of a motor power simulation apparatus for fuel cell power module evaluation which reflects properties of a vehicle, according to an exemplary embodiment of the present invention, and FIG. 2 is a circuit diagram of the ripple generator shown in FIG. 1.

In the present invention, an evaluation target may be power performance of a fuel cell power module 10. A reason for evaluating the power performance of the fuel cell power module 10 may be, for example, to evaluate the durability and performance properties of a hydrogen fuel cell vehicle.

To secure reliable evaluation of the durability and performance of a hydrogen fuel cell vehicle, it is necessary to evaluate the power performance of the fuel cell power module 10 under the same conditions experienced by the actual vehicle. Therefore, to evaluate fuel cell power module 10 under conditions that simulate actual vehicle conditions, the present invention provides a motor power simulating apparatus for fuel cell power modulation evaluation that reflects properties of the vehicle.

According to the techniques herein, the motor power simulating device may include a fuel cell power module 10, a ripple current generator 11, and an electronic load device 12. The fuel cell power module 10 may be, for example, a stack, an air supply device, a hydrogen supply device, a cooling device, or the like. The electronic load device 12 may sense the lifespan of a fuel cell or the amount of electricity generation per unit time of the fuel cell by consuming electric energy generated for driving by the fuel cell. The electric characteristics of the electronic load device 12 may then be forwarded to a controller for use as data to assess and evaluate performance of the fuel cell. In other words, by using the electronic load device 12, the power performance (voltage) of the fuel cell power module 10 may be evaluated.

When the power performance of the fuel cell is evaluated by consuming electric energy generated for driving by the fuel cell through the electronic load device 12, the current drawn from the fuel cell power module 10 needs to be drawn in a form that includes electric current ripples in order to simulate real world vehicle conditions.

The ripple current generator 11 may be a device that generates ripple current between the fuel cell power module 10 and the electronic load device 12. To supply the output power generated from the fuel cell to the motor, conversion into alternating current (AC) power with a boosting-type direct current-direct current (DC-DC) converter or a single-phase or three-phase DC-AC converter is generally required. During the DC-AC power conversion process, low-frequency ripple current and high-frequency ripple current are generated. Accordingly, ripple current is typically generated during conversion of the output power of the fuel cell (i.e., DC power) into AC power. Ripple current may also be generated during power performance evaluation of the fuel cell power module 10, so that simulation may be performed under the same conditions present during operation of a fuel cell vehicle.

The ripple current generator 11 may be configured as a circuit with a switching variable resistor 14, which is connected to a positive (+) terminal of an output line coming from the fuel cell power module 10, and a capacitor 13, in order to simulate power generation of a fuel cell vehicle. The switching variable resistor 14 may change while having a predetermined frequency, or a frequency in a white noise form, to adjust the amplitude of the generated ripple current, thus simulating the ripple current normally found during operation of a fuel cell vehicle.

Therefore, according an exemplary embodiment of the present invention, the ripple current generator 11 may be installed between the fuel cell power module 10 and the electronic load device 12 to convert power output from the fuel cell power module 10, ripple current may be generated such that equivalent evaluation to in the vehicle conditions can be performed in evaluation with respect to the fuel cell power module 10, thereby securing reliability in evaluation of durability and performance of a fuel cell vehicle. Moreover, by using the simple variable resistor 14 without a need for additional testing and evaluation facility, and budget for power evaluation with respect to the fuel cell system, real world vehicle simulation of motor power may be possible.

The techniques herein provide a number of advantages. For example, the ripple current generator may be installed between the fuel cell power module and the electronic load device to generate ripple current during DC/AC conversion of power output from the fuel cell power module, thereby accurately simulating real world vehicle conditions in fuel cell power module evaluation and thus securing reliability in evaluation of durability and performance of the fuel cell vehicle. Additionally, by using the simple variable resistor without a need for additional testing and evaluation facilities evaluation of motor power under real world conditions at a significantly reduced evaluation cost may be possible.

[Description of Reference Numerals]

| | |
|---|---|
| 10: Fuel Cell Power Module | 11: Ripple Current Generator |
| 12: Electronic Load Device | 13: Capacitor |
| 14: Variable Resistor | |

What is claimed is:

1. A motor power simulating system for fuel cell power module evaluation, comprising:
   a fuel cell power module;
   a ripple current generator; and
   an electronic load device for consuming the power generated by the fuel cell power module, wherein the ripple current generator is connected directly to the fuel cell power module and the electronic load device, and wherein the ripple current generator consists of a switching variable resistor and a capacitor, and the switching variable resistor is connected to a positive terminal of the fuel cell power module such that the switching variable resistor changes its resistance while having a predetermined frequency to adjust the amplitude of a generated ripple current, thus simulating the ripple current normally found during operation of a fuel cell vehicle.

2. The apparatus of claim 1, wherein the variable resistor has a frequency corresponding to white noise.

3. A fuel cell power module estimation method, comprising:

connecting a ripple current generator directly to the fuel cell power module and an electronic load device, the ripple current generator consisting of a switching variable resistor connected to a positive terminal of an output line coming from a fuel cell power module and a capacitor, in order to simulate power generation of a fuel cell vehicle;

changing a resistance of the switching variable resistor to adjust an amplitude of the generated ripple current, thus simulating the ripple current between the fuel cell power module and the electronic load device; and evaluating performance of the fuel cell by using electric characteristics of the electronic load device.

4. A motor power simulating apparatus for fuel cell power module evaluation, comprising:

a ripple current generator consisting of a switching variable resistor and a capacitor, and the switching variable resistor is connected to a positive terminal of a fuel cell power module such that the switching variable resistor changes its resistance while having a predetermined frequency, or a frequency in a white noise form, to adjust the amplitude of a generated ripple current, thus simulating the ripple current normally found during normal operation of a fuel cell vehicle.

* * * * *